United States Patent [19]

Blake

[11] Patent Number: 5,649,766
[45] Date of Patent: Jul. 22, 1997

[54] METHOD AND DEVICE FOR TESTING AIRFLOW IN AN ENCLOSED CABINET FOR ELECTRONIC EQUIPMENT

[75] Inventor: Martin K P. Blake, Bishops Waltham, England

[73] Assignee: Vero Electronics Ltd., Hampshire, United Kingdom

[21] Appl. No.: 348,970

[22] Filed: Nov. 28, 1994

[30] Foreign Application Priority Data

Nov. 29, 1993 [GB] United Kingdom ............... 9324461

[51] Int. Cl.⁶ .................. G01N 25/20; G01K 1/14; G01K 3/06; G01K 11/12
[52] U.S. Cl. .................. 374/45; 374/137; 374/162; 374/141
[58] Field of Search .............. 374/45, 162, 141, 374/137

[56] References Cited

U.S. PATENT DOCUMENTS

| | | | |
|---|---|---|---|
| 2,945,305 | 7/1960 | Strickler | 374/162 |
| 3,219,993 | 11/1965 | Schwertz | 374/162 |
| 3,617,374 | 11/1971 | Hodson | 374/162 |
| 3,620,889 | 11/1971 | Baltzer | 374/162 |
| 3,889,053 | 6/1975 | Lloyd et al. | |
| 4,390,275 | 6/1983 | Schilf et al. | |
| 4,838,664 | 6/1989 | Graham | |
| 4,891,250 | 1/1990 | Weibe et al. | |
| 4,945,919 | 8/1990 | Hattori | 374/162 |
| 4,952,033 | 8/1990 | Davis | 374/162 |

FOREIGN PATENT DOCUMENTS

| | | | |
|---|---|---|---|
| 0157501 | 6/1989 | Japan | 374/162 |
| 402152189 | 6/1990 | Japan | 374/162 |
| 1553240 | 9/1979 | United Kingdom | |
| 2217011 | 10/1989 | United Kingdom | 374/162 |
| 2093055 | 8/1992 | United Kingdom | |

OTHER PUBLICATIONS

IBM Technical Disclosure Bulletin, "Microencapsulated Liquid Crystal Silkscreen for Component–Failure Detection", vol. 32, No. 7, Dec. 1, 1989, pp. 312–314.

Ericsson Review, Ake Malhammar, "Thermal Dimensioning of Air–Cooled Printed Board Assemblies", vol. 70, No. 4, Jan. 1, 1993, pp. 126–131.

Feinwerktechnik & Messtechnik, "Gefahrdete Bauelement-eanschlusse auf Leiterplatten aus Epoxidharz spannungsoptisch sichtbar gemacht, vol. 84, No. 7, oct. 1976, pp. 326–330".

Primary Examiner—Diego F. F. Gutierrez
Attorney, Agent, or Firm—Oliff & Berridge

[57] ABSTRACT

In order to test airflow in a cabinet for electronics equipment, a board which has an array of thermochromic indicators is positioned in the cabinet, hot air is introduced into the cabinet; and a thermographic pattern in the nature of isotherms which may be formed on the board is observed.

2 Claims, 1 Drawing Sheet

METHOD AND DEVICE FOR TESTING AIRFLOW IN AN ENCLOSED CABINET FOR ELECTRONIC EQUIPMENT

BACKGROUND TO THE INVENTION

1. Field of the Invention

This invention relates to thermal management of electronics equipment, and especially, although not necessarily, to thermal management of equipment in the form of one or more printed circuit boards that are located in a cabinet, as is normally the case in computer, telecommunications or other equipment.

Because, in such equipment, a number of circuit boards may he located in a confined space, it is often necessary to provide the cabinet with a forced cooling arrangement, for example in which air is introduced into an inlet and blown or drawn through the cabinet over the circuit boards by means of a fan. In designing such equipment cabinets and the layout of the boards and any other equipment contained therein, it is clearly necessary to ensure that all components receive an adequate degree of cooling. This is not a simple task. In particular, it can be difficult to ensure that a constant supply of coolant air flows over the entire surface of the circuit boards due to the physical complexity of the interior of the cabinet.

2. Description of the Prior Art

It is known from patent specification U.S. Pat. No. 4,838,664 to check for incorrect operation of components on a circuit board by overlaying the circuit board with an overlay having thermochromic regions corresponding to the components and each such that when the respective components are at their normal operating temperatures the colours of the regions are the same, but such that if a component is over-heating or under-heating the respective thermochromic region provides a different colour.

It is also known from patent specification U.S. Pat. No. 3,889,053 to check a circuit board by coating the circuit board and also a reference circuit board with a thermochromic coating and to compare a video image of the circuit board being checked with a video image of the reference circuit board.

Furthermore, it is known from patent specification U.S. Pat. No. 4,891,250 to check the operation of individual components on a circuit board by coating the individual components with thermochromic indicators and noting the colours of the indicators in operation.

Thermochromic plates are described more generally in patent specifications GB-A-1 553 240 and U.S. Pat. No. 4,390,275, and thermochromic materials are described in more detail in patent specification GB-A-2 093 055.

SUMMARY OF THE INVENTION

None of the prior art mentioned above is concerned specifically with testing the airflow within a cabinet for electronics equipment, and an object of the first aspect of the present invention is to provide such a method.

In accordance with the present invention, there is provided a method of testing airflow within a cabinet for electronics equipment that is provided with an inlet for coolant air, which comprises:

positioning one or more boards within the cabinet, the or each board having over a major surface thereof, a thermochromic indicator that undergoes a reversible visible colour change at a temperature within a predetermined range;

introducing into the inlet, air at a temperature different to that of the board; and observing any thermographic pattern so formed on the surface of the or each board.

Such a method is therefore particularly useful to a designer of such cabinets to ensure that there is an adequate airflow distribution in the cabinet.

An object of a second aspect of the invention is to provide a temperature indicator board which may be used with such a method.

In accordance with the second aspect of the present invention, there is provided a temperature indicator board for mapping temperature within a cabinet for electronics equipment, which board has, over a major surface thereof, a set of arrays of thermochromic indicators, each array of indicators undergoing a reversible visible colour change at a temperature within a respective predetermined range, and the temperature ranges of the different arrays being different.

Using such a circuit board, it is possible to produce a thermographic pattern in the nature of isotherms.

An object of a third aspect of the present invention is to provide a board which enables thermal effects to be monitored including those caused by heat generating components on the board.

In accordance with the third aspect of the invention, there is provided a temperature indicator board for mapping temperature within a cabinet for electronics equipment, which board has, over at least substantially an entire major surface thereof, a thermochromic indicator that undergoes a reversible visible colour change at a temperature within a predetermined range, and a plurality of laminar heaters located on the surface of the board.

By using laminar heaters on a test board, rather than electronic components which will actually be used, the cost of the board is less and the supply of power to the heaters is simplified.

The board according to an embodiment of the invention provides a simple, effective and reliable means of determining directly whether or not the proposed layout of the cabinet will ensure adequate cooling of all the components therein, and enables the designer to determine relatively rapidly what the effects of various adjustments to the layout of the cabinet are. In order to test the airflow within a cabinet that is provided with an inlet for coolant air, one or more of the boards according to the invention are positioned within the cabinet, air is introduced into the inlet at a temperature different to that of the board, and any thermographic pattern so formed on the surface of the or each board is observed, isotherms on the board being visible as areas of the same colour. In the preferred procedure, the air that is introduced into the inlet is at a temperature that is higher than that of the board and higher than the temperature or temperature range under which the thermochromic indicator undergoes its visible colour change. Thus, for example, the designer may simply insert one or more of the boards into their appropriate slots in the cabinet, switch on the fan of the cabinet cooling system, and position a hot air gun at the air inlet. After a few seconds it will be possible to observe a thermographic pattern appearing on the surface of the board, and it can be relatively simple to determine at which parts of the board, if any, the air is quiescent and which parts of the board are subject to a strong cooling effect. In this method of operation, the particular temperature at which the visible colour change occurs is not directly relevant, and indeed the hottest parts of the board in the test method will correspond to the parts of the board that are cooled most effectively when the equipment is in use. Thus the thermographic pattern simply provides information about the degree of airflow over the circuit board.

In order to be suitable for use in electronics equipment cabinets, for example in nineteen inch racks, the board preferably is one of a number of standard card sizes. Thus, for example, the board may be of a standard Eurocard size, in which it has a longitudinal dimension of 160 mm, and increments of 60 mm thereafter, and a lateral dimension of substantially 100, 233 or 367 mm, or it may be a metric board in accordance with IEEE P1301, having a lateral dimension of substantially 150, 300, 450 or 600 mm. A board of the appropriate size can simply be slotted into one of the card slots of the cabinet with minimum effect on the airflow within the cabinet.

Preferably the thermochromic indicator is based on a liquid crystal. Such materials can be used to formulate a variety of compositions which change colour through the visible spectrum over a defined temperature range and in which both the low temperature (red) start point and the temperature width (from the outset of red to the green/blue change) can be specified. Such compositions are commercially available from Merck Ltd, Advanced Materials Division, Poole, UK under the trade mark "LICRITHERM". They may be applied by screen printing, flexographic printing, ink jet printing or by air knife or blade systems, and are preferably applied on to a black sub layer in order to provide appropriate contrast. The thermochromic indicator is preferably chosen so that it undergoes a visible colour change within the range of 25° to 40° C.

Although a thermographic image may form on the board as soon as hot air is blown into the cabinet, it may be relatively transient once the board has been removed from the cabinet if the board has not had sufficient time within the cabinet to heat up. Thus, it may be appropriate to leave the board in the cabinet for a number of minutes until it has reached or approaches its steady-state temperature or at least until its interior has become warm, in which case it will retain the thermographic image when removed from the cabinet for sufficient time for it to be photographed. The board preferably has a thermal conductivity of at least 0.05, more preferably at least 0.1, especially at least 0.15 and most especially at least 0.2 $Wm^{-1}K^{-1}$ since values of conductivity significantly below this level may allow the surface of the board to be chilled when it is removed from the cabinet, thereby causing the image to be lost. The board preferably has a thermal conductivity of not more than 1, preferably not more than 0.5 and especially not more than 0.3 $Wm^{-1}K^{-1}$ since it may be difficult with boards having substantially higher conductivity values to prevent dissipation of the isotherms due to the conductivity of the board material in the plane of the board.

The board is preferably formed from a thermoset resin, eg a glass-epoxy composition from which conventional circuit boards are formed. The board may, if desired, be provided with an electrically conductive surface layer and/or intermediate layers, although it is preferred for no such layers to be present since they may dissipate heat over the surface of the board. At least it is preferred for any such layers of high thermal conductivity such as copper to be sufficiently thin, or otherwise arranged eg by being divided into separate small areas, to limit dissipation of heat over the surface of the board and thus inhibit formation of the thermographic pattern.

The board may alternatively be formed from a transparent material eg an acrylate, and arranged so that the thermochromic indicator may be viewed through the board, for example by coating the acrylate board with the thermochromic indicator and coating the indicator with the black backing layer. Other layers may be included in this arrangement if desired.

Circuit boards are often provided with a front plate, for example daughter boards that are intended to be inserted into a cabinet and connected to a backplane or mother board by means of one or more edge connectors located at the rear of the daughter board. The front plate of such boards is normally formed as an aluminium or other metal plate located on the front edge of the board and extending in a plane perpendicular to that of the board, so that the front plates of an array of adjacent daughter boards together form at least part of the front surface of the cabinet. In the case of a board according to the present invention it may be advantageous to provide it with a transparent front plate in order to enable the thermographic pattern formed on the surface of the board to be viewed.

It is possible for more than one thermochromic indicator to be employed with a board according to the invention, in which case it is preferred for the temperature ranges over which the thermochromic indicators undergo their visible colour changes not to overlap. If a number of thermochromic indicators are employed, then where there are significant temperature gradients over the surface of the board, a number of distinct groups of isotherms may be visible. The different thermochromic indicators may, for instance, be printed on the board as a pattern of dots or small areas that together cover substantially the entire major surface of the board in such a way that any local area of the board contains at least one dot or small area of each thermochromic indicator.

While it is possible to observe a thermographic pattern according to the invention in a very simple manner simply by introducing heated air into the cooling inlet of the cabinet, thereby showing regions of different degrees of airflow, such a method will not give a direct indication of the temperature pattern of the board in use. Alternatively, the board may be provided with one or more laminar heaters located on a surface thereof, which may for example be powered via an edge connector on the board. A single laminar heater may be employed which could extend over substantially an entire major surface of the board, or more than one heater could be used which may have the same or different values of power per unit area, in order to mimic the heat generation of different components proposed to be used. In such a way a thermal map may be generated that takes into account both the characteristics of the components on the board and the characteristics of the cabinet.

Indeed, the thermochromic indicator need not be employed solely to test the cooling mechanism of a cabinet but may instead be employed according to the invention to map heat generated by a printed circuit board in operation. One method by which this may be achieved comprises positioning against a printed circuit board a planar element that has, on a major surface thereof, a thermochromic indicator that undergoes a reversible visible colour change at a temperature within a predetermined range, so that the thermochromic indicator is in thermal contact with the board to an extent sufficient to reflect the temperature of the board, powering up the board and observing any thermographic pattern so formed by the thermochromic indicator.

In such a method, the planar element may be a thin flexible plastics sheet formed for example from a polyester, or a rigid board formed for example from an acrylic. In each case it is preferable for the sheet or board to be transparent and to have the thermochromic indicator applied thereto followed by a black backing layer so that the indicator is mechanically protected by the backing layer, and colour changes can be observed through the sheet or board.

Other objects, Features and advantages of the present invention will become apparent From the Following detailed description of two Forms of board and a method according to the invention.

DETAILED DESCRIPTION OF PREFERRED EMBODIMENTS

Figure 1:
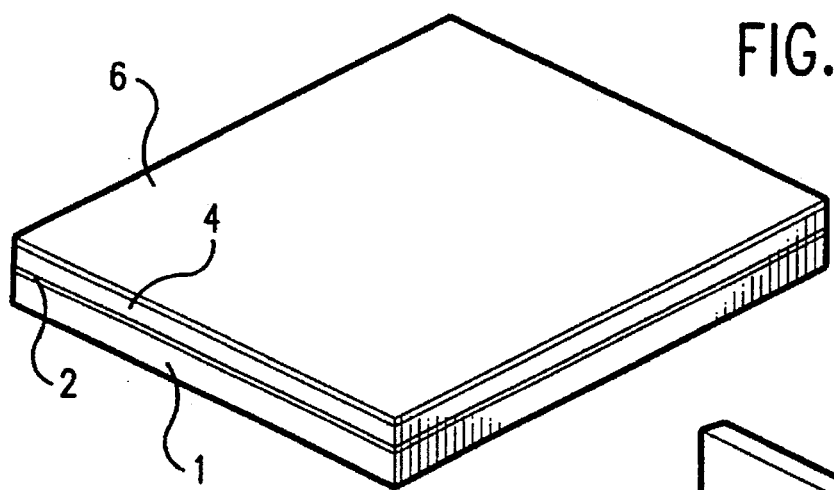
FIG. 1 is a schematic perspective view of one form of board in accordance with the present invention in which the thicknesses of various layers have been exaggerated for the sake of clarity.

Referring to the accompanying drawings, FIG. 1 shows an indicator board 1 according to the invention which comprises a board formed from a standard FR4 glass fibre epoxy composition having a o thermal conductivity of 0.24 $Wm^{-1}K^{-1}$ that has been coated with a thin layer 2 of black pigment, and a 12–15 µm thick layer 4 of a thermochromic indicator followed by a 10 µm thick transparent plastics surface layer 6 that protects the thermochromic indicator 4 from mechanical damage during handling of the board. The thermochromic indicator 4 is chosen so that it is transparent at temperatures below 27° C. and over the temperature range from 27° to 33° C. it shows colours of the spectrum from red to green. Over the next few degrees it goes through the colours blue indigo and violet and then, at about 40° C. it becomes transparent again.

Figure 2A:
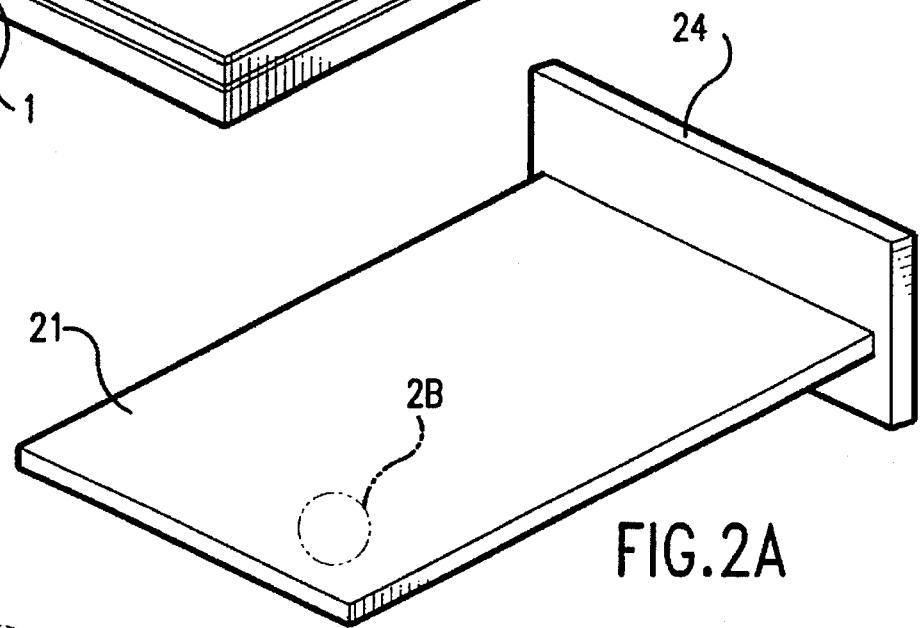
FIG. 2 is a schematic perspective view of a second form of board according to the invention.
Figure 2B:
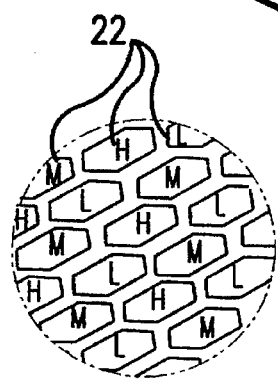

FIG. 2 shows another form of indicator board according to the invention which comprises a standard board 21 on which a black layer has been coated followed by three different thermochromic indicators, and a final transparent protective plastics coating. The thermochromic indicators have each been printed on the black layer by a silk screen printing process to form a pattern of small areas 22 of generally hexagonal shape. Each hexagonal area has dimensions of approximately 1 to 2 mm and contains one only of the three thermochromic indicators. Each thermochromic indicator has a red to green temperature width of 6° C., and has a different start (onset of colour) temperature, the three start temperatures being, 27° C., 35° C. and 47° C. for the indicators designated L(low), M(medium) and H(high) in the enlarged portion of the figure respectively. In addition, the board is provided with a transparent polymethylmethacrylate front panel 24.

Figure 3:
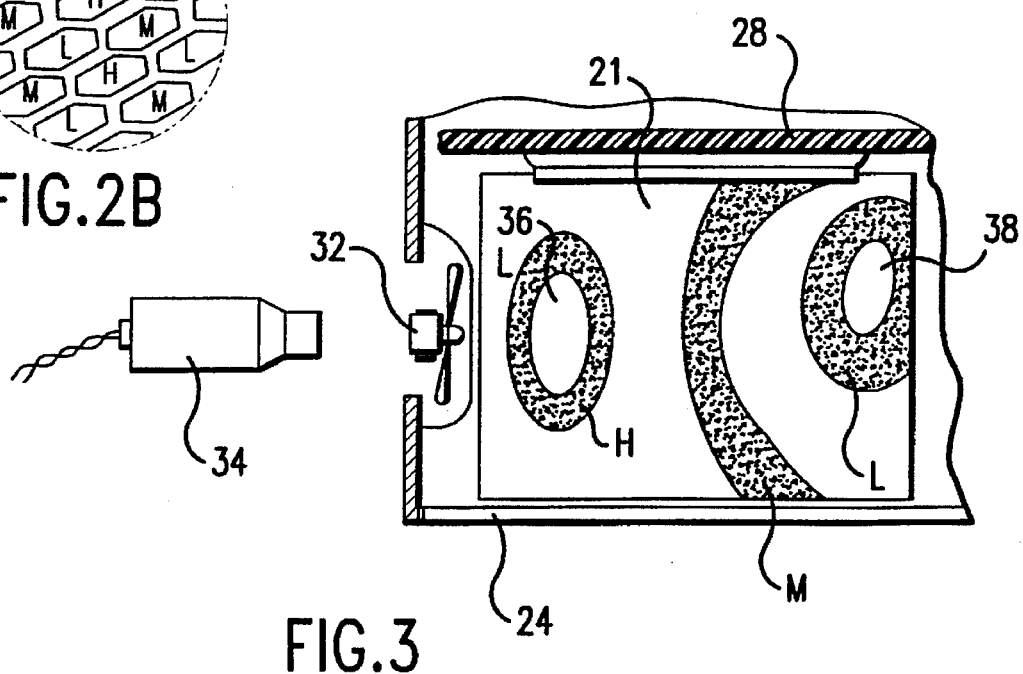
FIG. 3 is a schematic view of the board shown in FIG. 2 being used to test a cooling arrangement of the cabinet.

The operation of the board is shown in FIG. 3. The board 21 has been inserted into a cabinet 26 so that the rear edge of the board abuts or is in the region of a backplane 28, and the front of the cabinet is formed by the transparent front panel 24 of the board. The cabinet has an air inlet 30 and an electric fan 32 to provide cooling for the electronic equipment within the cabinet. In operation, the fan 32 is switched on and a hot air blower 34 is positioned outside the cabinet in the region of the air inlet so that hot air will be blown over the indicator board 21 by the fan 32. A thermographic pattern can be observed on the board comprising three rough isotherms H, M and L (high, medium and low temperature respectively), each rough isotherm being split into colours of the spectrum. As shown in the drawing, one area 36 of the board is relatively hot, indicating that this area 36 will receive efficient cooling by the fan 32 in actual operation, while another area 38 is relatively cool, indicating that the area 38 is a quiescent area that may receive insufficient cooling by the fan in actual operation.

The board may be viewed inside the cabinet if it is provided with a transparent front panel 24. Alternatively, or in addition, it may be removed from the cabinet once it has reached or approaches a steady-state temperature, and can be observed and/or photographed. Typically the board will be left in the cabinet for 10 to 30 minutes, and the thermographic image will remain on the board after removal from the cabinet for up to two minutes or even longer.

What I claim is:

1. A method of testing airflow within a cabinet for electronics equipment, the cabinet provided with an inlet for coolant air, to check the adequacy of airflow distribution in the cabinet during a cabinet design operation, comprising the steps of:

positioning at least one board within the cabinet during the cabinet design operation, said at least one board having, over a major surface thereof, a thermochromic indicator that undergoes a reversible visible colour change at a temperature within a predetermined range;

introducing air into the inlet at a temperature different to that of the board to produce on said major surface a thermographic image indicative of the pattern of airflow over said surface;

observing the thermographic image so produced to determine the airflow distribution within the cabinet; and analyzing the thermographic image to determine the adequacy of the airflow distribution.

2. A method as claimed in claim 1, wherein the air introduced into the inlet is at a temperature higher than that of the board and higher than the temperature range under which the thermochromic indicator undergoes its visible colour change.

* * * * *